United States Patent
Cai et al.

(10) Patent No.: US 8,735,929 B2
(45) Date of Patent: May 27, 2014

(54) LIGHT-EMITTING DIODE PACKAGE

(71) Applicant: Lextar Electronics Corporation, Hsinchu (TW)

(72) Inventors: Pei-Song Cai, Miaoli County (TW); Yun-Yi Tien, Hsinchu (TW); Tzu-Pu Lin, Taipei (TW); Chun-Wei Wang, New Taipei (TW); Jian-Chin Liang, Hsinchu (TW)

(73) Assignee: Lextar Electronics Corporation, Hsinchu (TW)

( * ) Notice: Subject to any disclaimer, the term of this patent is extended or adjusted under 35 U.S.C. 154(b) by 0 days.

(21) Appl. No.: 13/861,420

(22) Filed: Apr. 12, 2013

(65) Prior Publication Data

US 2013/0270594 A1    Oct. 17, 2013

(30) Foreign Application Priority Data

Apr. 12, 2012 (TW) .............................. 101113087 A

(51) Int. Cl.
*H01L 33/00* (2010.01)

(52) U.S. Cl.
USPC .................................... 257/98; 257/E33.059

(58) Field of Classification Search
USPC ............................................ 257/98, E33.059
See application file for complete search history.

(56) References Cited

U.S. PATENT DOCUMENTS

| | | | | |
|---|---|---|---|---|
| 8,030,839 B2 * | 10/2011 | Hosokawa et al. | ........... | 313/503 |
| 8,519,427 B2 * | 8/2013 | Lee | ................... | 257/99 |
| 2013/0026507 A1 * | 1/2013 | Chung et al. | .................... | 257/88 |
| 2013/0121000 A1 * | 5/2013 | Lee et al. | ....................... | 362/293 |

FOREIGN PATENT DOCUMENTS

TW            M395914            1/2011

OTHER PUBLICATIONS

English Abstract translation of TWM395914 (Published Jan. 1, 2011).

* cited by examiner

*Primary Examiner* — Trung Q Dang
(74) *Attorney, Agent, or Firm* — McClure, Qualey & Rodack, LLP

(57) ABSTRACT

A light-emitting diode (LED) package comprising a carrier, an LED chip and a phosphor glue is provided. The carrier has a recess, an upper surface, and a ring-shape rough surface connected to a top edge of the recess. The LED chip is disposed within the recess. The phosphor glue fills up the recess and over the upper surface of the carrier. An edge of the phosphor glue contacts the ring-shape rough surface.

12 Claims, 4 Drawing Sheets

LIGHT-EMITTING DIODE PACKAGE

This application claims the benefit of Taiwan application Serial No. 101113087, filed Apr. 12, 2012, the subject matter of which is incorporated herein by reference.

BACKGROUND OF THE INVENTION

1. Field of the Invention

The invention relates in general to a light-emitting diode (LED) package, and more particularly to an LED package capable of increasing luminous efficiency.

2. Description of the Related Art

Conventionally, the light-emitting diode (LED) package comprises a phosphor layer and an LED chip, wherein the phosphor layer encapsulates the LED chip, such that the light emitted by the LED chip is emitted off the LED package after passing through the phosphor layer.

However, after the phosphor layer is formed, a top surface of the phosphor layer is normally a plane or a concave surface, impeding the increase in the luminous efficiency of the LED package.

SUMMARY OF THE INVENTION

The invention is directed to a light-emitting diode (LED) package having superior luminous efficiency.

According to an embodiment of the present invention, a light-emitting diode (LED) package comprising a carrier, an LED chip and a phosphor glue is provided. The carrier has a recess, an upper surface, and a ring-shape rough surface connected to a top edge of the recess. The LED chip is disposed within the recess. The phosphor glue fills up the recess and over the upper rough surface of the carrier. An edge of the phosphor glue contacts the ring-shape rough surface.

The above and other aspects of the invention will become better understood with regard to the following detailed description of the preferred but non-limiting embodiment(s). The following description is made with reference to the accompanying drawings.

DETAILED DESCRIPTION OF THE INVENTION

Figure 1A:
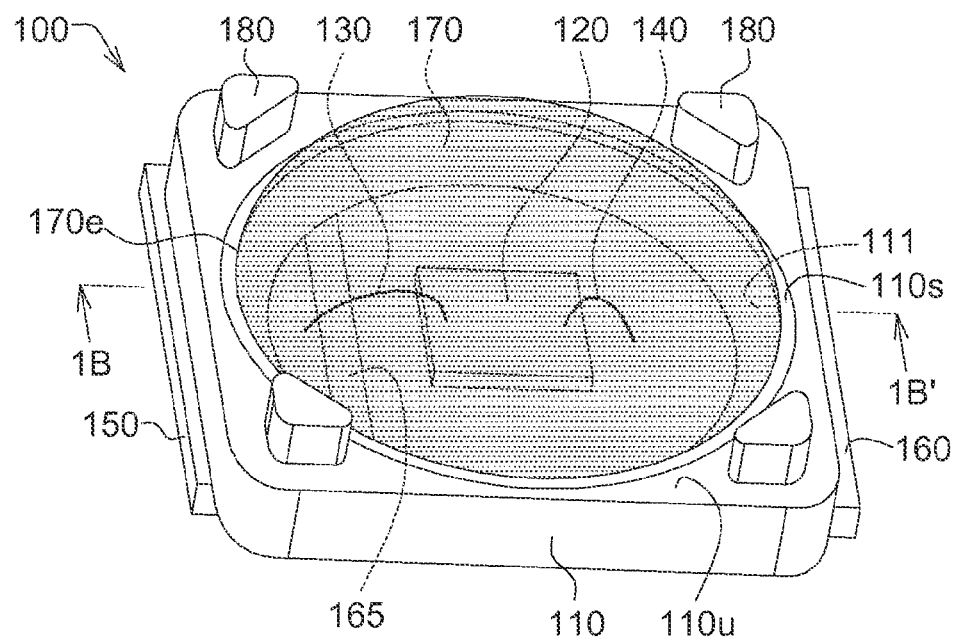
FIG. 1A shows an appearance diagram of an LED package according to an embodiment of the invention.

Referring to FIG. 1A, an appearance diagram of an LED package according to an embodiment of the invention is shown. The light-emitting diode (LED) package 100 comprises a carrier 110, an LED chip 120, a first solder wire 130, a second solder wire 140, a first electrode 150, a second electrode 160, an insulator 165, a phosphor glue 170 and at least one protrusion 180.

The carrier 110 is formed by high polymer such as plastics. The carrier 110 has a recess 111, an upper surface 110u and a ring-shape rough surface 110s. In the present embodiment, the opening of the recess 111 is exemplified by a circular shape. In another embodiment, the opening of the recess 111 can be elliptical or polygonal. If the opening of the recess 111 is a polygon, preferably but not restrictively, the corners of the polygon are rounded chamfers, such that the phosphor glue 170 can be spontaneously formed to be difficult to disintegrate.

The LED chip 120 is disposed within the recess 111. The active surface of the LED chip 120 is disposed on one of the first electrode 150 and the second electrode 160 in a face-up orientation. In the present embodiment, the active surface of the LED chip 120 is disposed on the second electrode 160.

The first solder wire 130 electrically connects the active surface of the LED chip 120 with the first electrode 150, and the second solder wire 140 electrically connects the active surface of the LED chip 120 with the second electrode 160.

The insulator 165 electrically isolates the first electrode 150 from the second electrode 160 to avoid the first electrode 150 being shorting with the second electrode 160.

The phosphor glue 170 can fill up the recess 111 by way of dispensing and covers the LED chip 120, such that the light (not illustrated) emitted by the LED chip 120 is emitted off the LED package 100 after passing through the phosphor glue 170.

Figure 1B:
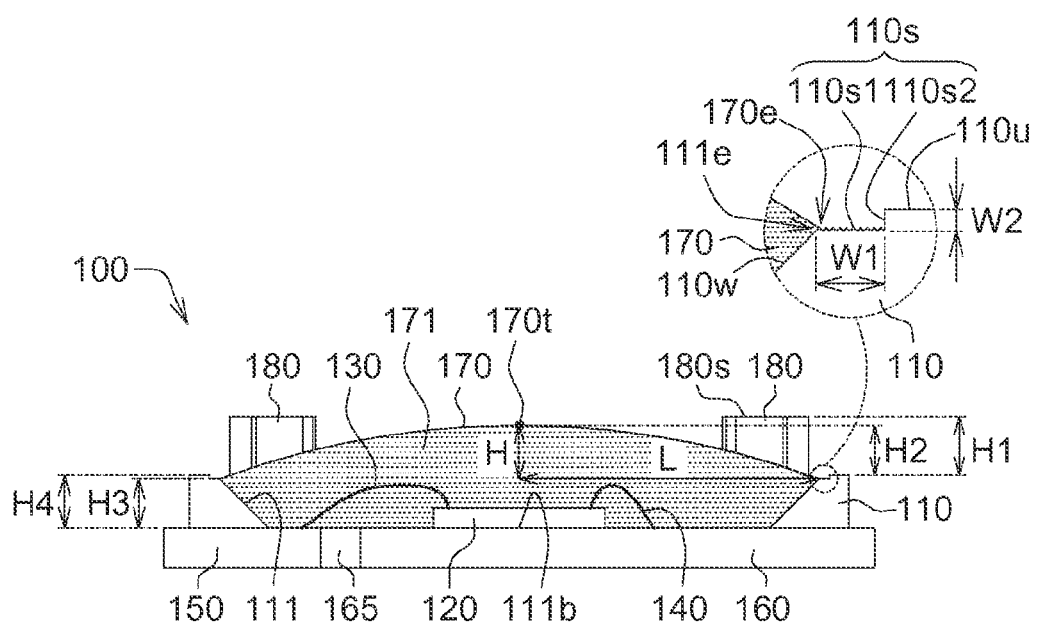
FIG. 1B shows a cross-sectional view along a direction 1B-1B' of FIG. 1A.

Referring to FIG. 1B, a cross-sectional view along a direction 1B-1B' of FIG. 1A is shown. During the process of forming the phosphor glue 170, due to the design of the ring-shape rough surface 110s, after the top edge 170e of the liquid-state phosphor glue 170 touches the ring-shape rough surface 110s. Then, the phosphor glue 170 receives a resisting force and produces a cohesion force making the middle portion of the phosphor glue 170 become protuberant and form a top portion 171 projecting from the upper surface 110u of the carrier 110. In comparison to the LED package lacking the ring-shape rough surface 110s, the phosphor glue 170 of the present embodiment projects from the upper surface 110u of the carrier 110, hence increasing the brightness of the LED package 100 by about 7%. However, the above ratio is not for limiting the embodiments of the invention.

It is not illustrated in the diagram that the phosphor glue 170 comprises an encapsulating body and a plurality of fluorescent particles, wherein the encapsulating body encapsulates the fluorescent particles. The light (such as a blue light) emitted by the LED chip 120 is further converted into a light of a different color (such as a green light, a yellow light or a red light) by the fluorescent particles. The converted light and the non-converted light are mixed together to form a light of an expected color such as a white light.

The fluorescent particles are such as (YGdTb)3(AlGa) 5O12:Ce, (SrBaCaMg)2SiO4:Eu, (Sr,Ba,CaMg)3SiO5:Eu, CaAlSiN3:Eu, CaScO4:Ce, Ca10(PO4)FCl:SbMn, M5(PO4)3Cl:Eu, BaBg2Al16O27:Eu, Ba, MgAl16O27:Eu, Mn, 3.5MgO 0.5MgF2 GeO2:Mn, Y2O2S:Eu, Mg6As2O11: Mn, Sr4Al14O25:Eu, (Zn,Cd)S:Cu, SrAl2O4:Eu, Ca10 (PO4)6ClBr:Mn, Eu, Zn2GeO4:Mn, Gd2O2S:Eu or La2O2S:Eu, wherein, M is an alkaline earth metal selected from a group consisting of strontium (Sr), calcium (Ca), barium (Ba), magnesium (Mg) and a combination thereof. Moreover, the size of fluorescent particles can be between 10~20 μm. In another embodiment, the size of fluorescent particles can be smaller than 10 μm, or larger than 20 μm.

As indicated in FIG. 1B, the carrier 110 further comprises a plurality of protrusions 180 disposed on the upper surface 110u of the carrier 110. The gap H1 between the terminal surface 180s of the protrusions 180 and the upper surface 110u of the carrier 110 is larger than the gap H2 between the vertex 170t of the phosphor glue 170 and the upper surface 110u of the carrier 110.

Figure 2:
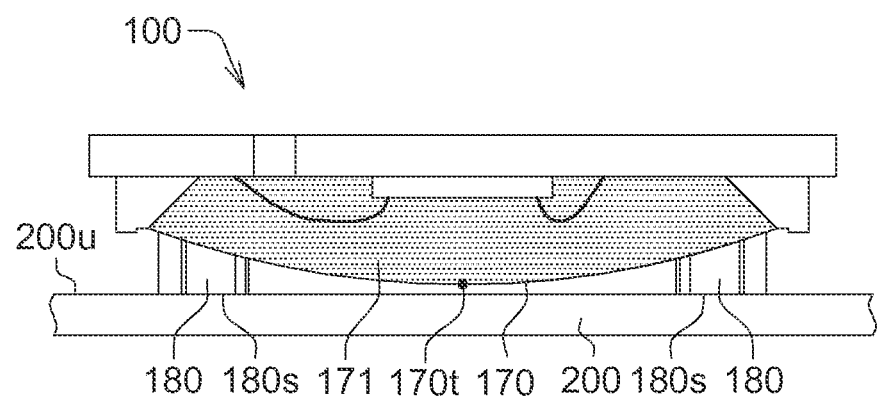
FIG. 2 shows an appearance diagram of the LED package of FIG. 1B being disposed on a testing equipment.

Referring to FIG. 2, an appearance diagram of the LED package of FIG. 1B being disposed on a testing equipment is shown. During the process of testing the LED package 100, after the protrusions 180 are disposed on the bearing surface 200u of the testing equipment 200, the vertex 170t of the protrusions 180 is higher than the phosphor glue 170, such that the top portion 171 of the phosphor glue 170 will not touch the bearing surface 200u of the testing equipment 200 and become polluted.

As indicated in FIG. 1B, the protrusions 180 are disposed adjacent to the edges of the carrier 110. In the present embodiment, the carrier 110 is a rectangular carrier, and at least four protrusions 180 are disposed adjacent to four corners of the carrier 110 (FIG. 1A). In another embodiment, the carrier 110 is a circular carrier, and the protrusions 180 can be disposed adjacent to the peripheral of the carrier 11, wherein two protrusions 180 are disposed in a diagonal orientation and the other two protrusions 180 are also disposed in a diagonal orientation.

The structural characteristics of the ring-shape rough surface 110s are elaborated below.

As indicated in FIG. 1B, the roughness of the ring-shape rough surface 110s is between 0.1~1.5 μm, but the embodiment of the invention is not limited thereto. By controlling the roughness of the ring-shape rough surface 110s, the magnitude of projection from the top of the phosphor glue 170 can be increased, and the luminous efficiency of the LED package 100 can be increased accordingly.

During the process of forming the phosphor glue 170, after the liquid-state phosphor glue 170a touches the top edge 111e of the recess 111, the liquid-state phosphor glue 170a immediately touches the ring-shape rough surface 110s to be is resisted by the ring-shape rough surface 110s.

As indicated in FIG. 1B, the top edge 170e of the phosphor glue 170 is separated from the vertex 170t of the phosphor glue 170 by a first distance L along a horizontal direction, and the top edge 170e is separated from the vertex 170t by a second distance H along a vertical direction. The ratio of the second distance H and the first distance L (H/L) is between 0.15~1.5, but the exemplified numeric range is not for limiting the embodiment of the invention.

Referring to Table 1, the relationships between the H/L ratio and the light extraction efficiency are shown. As indicated in Table 1, when the H/L ratio is higher than 0.1, the brightness of the LED package 100 of embodiment of the invention is significantly increased, and is positively proportional to the H/L ratio. When the H/L ratio is higher than 0.2, the brightness is increased by at least 7%.

TABLE 1

| H/L | Light Extraction Efficiency |
|---|---|
| 0.1 | 100.00% |
| 0.15 | 104.5% |
| 0.2 | 106.9% |
| 0.3 | 107.5% |
| 0.4 | 108.1% |

TABLE 1-continued

| H/L | Light Extraction Efficiency |
|---|---|
| 0.5 | 108.6% |
| 0.6 | 109% |
| 0.7 | 109.3% |
| 0.8 | 109.6% |
| 0.9 | 109.9 |
| 1 | 110.1% |

The ring-shape rough surface 110s comprises an upper rough surface 110s1 and a lateral surface 110s2, wherein the upper rough surface 110s1 is connected to an inner wall 111w of the recess 111, and the lateral surface 110s2 connects to the upper rough surface 110s1 with the upper surface 110u of the carrier 110. In the present embodiment, the upper rough surface 110s1 is substantially parallel to the upper surface 110u of the carrier 110 but does not have to be parallel to the upper surface 110u of the carrier 110. The lateral surface 110s2 is substantially perpendicular to the upper rough surface 110s1 of the ring-shape rough surface 110s, but the embodiment of the invention is not limited thereto. Furthermore, the inner wall 111w has a slope, and can be a conical surface or a flat bevel.

In an embodiment, the upper rough surface 110s1 has a width W1 between 200~1000 μm, and the lateral surface 110s2 has a height W2 between 10~1000 μm. In another embodiment, the lateral surface 110s2 can be omitted. Under such design, the upper rough surface 110s1 is substantially aligned with the upper surface 110u of the carrier 110, and the two surfaces are such as co-planar.

The ring-shape rough surface 110s is lower than the upper surface 110u of the carrier 110. In greater details, the gap H3 between the upper rough surface 110s1 of the ring-shape rough surface 110s and the bottom 111b of the recess 111 is smaller than the gap H4 between the upper surface 110u and the bottom 111b of the recess 111, such that a ring-shape recess is formed accordingly. However, the embodiment of the invention is not limited thereto.

Figure 3:
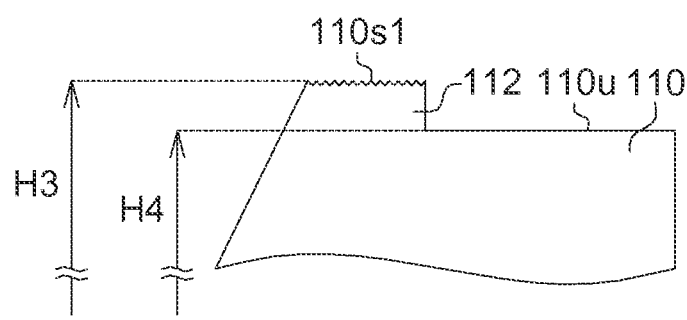
FIG. 3 shows a partial cross-sectional view of a carrier according to another embodiment of the invention.

Referring to FIG. 3, a partial cross-sectional view of a carrier according to another embodiment of the invention is shown. In the present embodiment, the ring-shape rough surface 110s is higher than the upper surface 110u of the carrier 110. In greater details, the gap H3 between the upper rough surface 110s1 of the ring-shape rough surface 110s and the bottom 111b of the recess 111 is larger than the gap H4 between the upper surface 110u and the bottom 111b of the recess 111, such that a protrusion 112 is formed accordingly.

In the above embodiments, the lateral surface 110s2 of the ring-shape rough surface 110s is perpendicular to the upper rough surface 110s1 of the ring-shape rough surface 110s, but the embodiment of the invention is not limited thereto.

Figure 4:
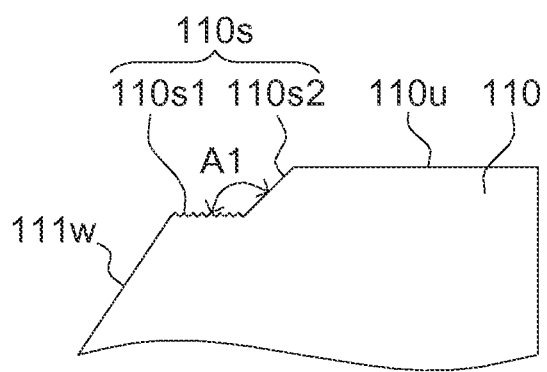
FIG. 4 shows a partial cross-sectional view of a carrier according to another embodiment of the invention.

Referring to FIG. 4, a partial cross-sectional view of a carrier according to another embodiment of the invention is shown. In the present embodiment, the lateral surface 110s2 of the ring-shape rough surface 110s is inclined towards the upper rough surface 110s1 of the ring-shape rough surface 110s. For example, an obtuse angle A1 is formed between the lateral surface 110s2 and the upper rough surface 110s1. As the lateral surface 110s2 is inclined towards the upper rough surface 110s1, a draft angle is naturally formed, and the carrier 110 formed in the injection molding process can be conveniently detached from the mold.

In the above embodiments, the upper rough surface 110s1 is exemplified by a rough surface, and the lateral surface 110s2 is exemplified by a non-rough surface. However, the embodiment of the invention is not limited thereto, and the lateral surface 110s2 can also be a rough surface.

Figure 5:
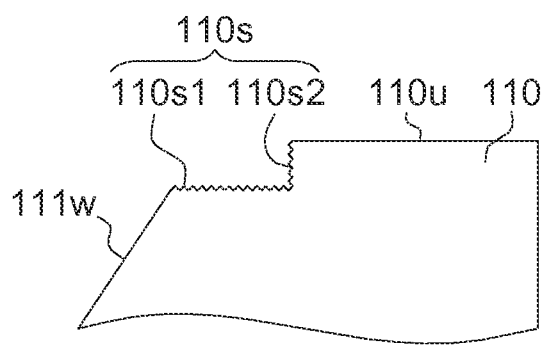
FIG. 5 shows a partial cross-sectional view of a carrier according to another embodiment of the invention.

Referring to FIG. 5, a partial cross-sectional view of a carrier according to another embodiment of the invention is shown. In the present embodiment, the lateral surface 110s2 is a rough surface whose roughness is substantially equal to or different from that of the upper rough surface 110s1.

In FIG. 5, as the lateral surface 110s2 is a rough surface, during the process of forming the phosphor glue 170, the liquid-state phosphor glue 170 is resisted by the upper rough surface 110s1 and flows to the lateral surface 110s2 from the upper rough surface 110s1. Then, the liquid-state phosphor glue 170 is resisted by the lateral surface 110s2 and produces a cohesion force making the phosphor glue 170 become protuberant and project from the upper surface 110u of the carrier 110. In comparison to the design of the lateral surface 110s2 having a non-rough surface, the rough lateral surface 110s2 increases the protrusion of the phosphor glue 170.

Figure 6:
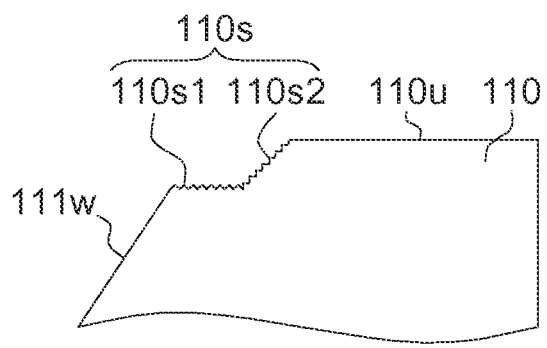
FIG. 6 shows a partial cross-sectional view of a carrier according to another embodiment of the invention.

Referring to FIG. 6, a partial cross-sectional view of a carrier according to another embodiment of the invention is shown. In the present embodiment, the lateral surface 110s2 is a rough surface and inclined towards the upper rough surface 110s1. As the lateral surface 110s2 is inclined towards the upper rough surface 110s1, a draft angle is naturally formed, and the carrier 110 formed in the injection molding process can be conveniently detached from the mold.

Figure 7:
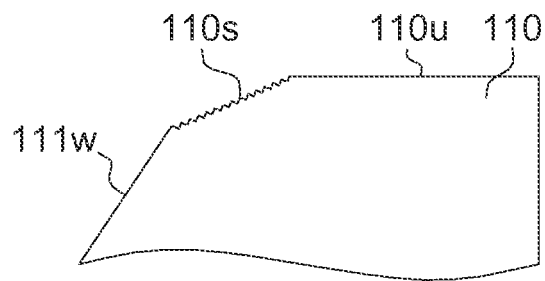
FIG. 7 shows a partial cross-sectional view of a carrier according to another embodiment of the invention.

Referring to FIG. 7, a partial cross-sectional view of a carrier according to another embodiment of the invention is shown. The ring-shape rough surface 110s is an inclined plane, and connects the upper surface 110u of the carrier 110 with the inner wall 111w of the recess 111.

Figure 8:
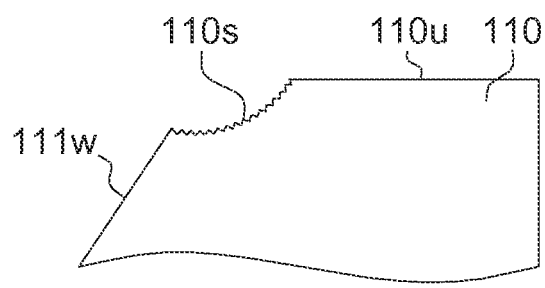
FIG. 8 shows a partial cross-sectional view of a carrier according to another embodiment of the invention.

Referring to FIG. 8, a partial cross-sectional view of a carrier according to another embodiment of the invention is shown. The ring-shape rough surface 110s is a curved plane, and connects the upper surface 110u of the carrier 110 with the inner wall 111w of the recess 111. Moreover, the curved plane can be a cylindrical plane, an oval place or a curved plane of any geometric shape.

Figure 9:
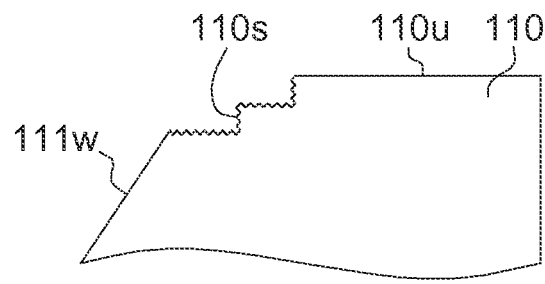
FIG. 9 shows a partial cross-sectional view of a carrier according to another embodiment of the invention.

Referring to FIG. 9, a partial cross-sectional view of a carrier according to another embodiment of the invention is shown. The ring-shape rough surface 110s is a stepped surface, and connects the upper surface 110u of the carrier 110 with an inner wall 111w of the recess 111.

As disclosed above, the ring-shape rough surface 110s can be formed by many surfaces, and at least one of the surfaces is a rough surface directly connected to a top edge of the recess. Besides, at least one of the surfaces is a horizontal plane, a vertical plane, an inclined plane or a curved plane.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A light-emitting diode (LED) package, comprising:
a carrier having a recess, an upper surface, and a ring-shape rough surface connected to a top edge of the recess;
an LED chip disposed within the recess; and
a phosphor glue filling up the recess and over the upper surface, wherein an edge of the phosphor glue contacts the ring-shape rough surface.

2. The LED package according to claim 1, wherein the ring-shape rough surface comprises an upper rough surface substantially parallel to the upper surface of the carrier and connected to an inner wall of the recess.

3. The LED package according to claim 2, wherein a gap between the ring-shape rough surface and a bottom of the recess is smaller than or larger than a gap between the upper surface of the carrier and the bottom of the recess.

4. The LED package according to claim 2, wherein the ring-shape rough surface further comprises a lateral surface, the upper rough surface of the ring-shape rough surface is connected to an inner wall, and the lateral surface of the ring-shape rough surface connects the upper rough surface of the ring-shape rough surface to the upper surface of the carrier.

5. The LED package according to claim 4, wherein the lateral surface of the ring-shape rough surface is inclined towards the upper rough surface of the ring-shape rough surface.

6. The LED package according to claim 4, wherein the lateral surface of the ring-shape rough surface is substantially perpendicular to the upper rough surface of the ring-shape rough surface.

7. The LED package according to claim 1, wherein the ring-shape rough surface is an inclined plane connecting the upper surface of the carrier with an inner wall of the recess.

8. The LED package according to claim 1, further comprising:
a plurality of protrusions disposed on the upper surface of the carrier, wherein a gap between the terminal surface of each protrusion and the upper surface of the carrier is larger than a gap between a vertex of the phosphor glue and the upper surface of the carrier.

9. The LED package according to claim 8, wherein the protrusions are disposed adjacent to the edges of the carrier.

10. The LED package according to claim 9, wherein the protrusions are disposed adjacent to the corners of the carrier.

11. The LED package according to claim 1, wherein the phosphor glue has a vertex, the edge of the phosphor glue is separated from the vertex of the phosphor glue by a first distance along a horizontal direction, the edge of the phosphor glue is separated from the vertex of the phosphor glue by a second distance along a vertical direction, and the ratio of the second distance and the first distance is between 0.1 and 1.5.

12. The LED package according to claim 1, wherein the shape of the opening of the recess is circular, elliptical or polygonal.

* * * * *